United States Patent
Kaneko (10) Patent No.: US 7,245,646 B2
(45) Date of Patent: Jul. 17, 2007

(54) SURFACE-EMITTING TYPE SEMICONDUCTOR LASER AND ITS MANUFACTURING METHOD, AND OPTICAL MODULE

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 233 days.

(21) Appl. No.: 11/035,097

(22) Filed: Jan. 14, 2005

(65) Prior Publication Data

US 2005/0163182 A1   Jul. 28, 2005

(30) Foreign Application Priority Data

Jan. 20, 2004   (JP) ............................ 2004-012116

(51) Int. Cl.
*H01S 5/00*   (2006.01)
(52) U.S. Cl. .............. 372/50.1; 372/34; 372/43.01
(58) Field of Classification Search ........... 372/50.1, 372/34, 43.01
See application file for complete search history.

(56) References Cited

U.S. PATENT DOCUMENTS 6,775,310 B2 *  8/2004  Sai et al. ............ 372/45.01

FOREIGN PATENT DOCUMENTS

| JP | A-5-283796 | 10/1993 |
|---|---|---|
| JP | A-9-232668 | 5/1997 |
| JP | A-10-261830 | 9/1998 |
| JP | A-11-261153 | 9/1999 |

* cited by examiner

*Primary Examiner*—Dung Nguyen
(74) *Attorney, Agent, or Firm*—Oliff & Berridge, PLC (57) ABSTRACT

To provide a surface-emitting type semiconductor laser that has good luminescence property and can be driven at high speeds, and its manufacturing method. In a surface-emitting type semiconductor laser having a first mirror, an active layer and a second mirror formed above a substrate, the surface-emitting type semiconductor laser in accordance with the present invention includes a columnar section including at least a portion of the second mirror, a first electrode formed above the first mirror or below the substrate, a second electrode formed above the second mirror, a dielectric layer formed around at least a portion of the columnar section and in contact with the columnar section, and a heat radiating section formed around at least a portion of the columnar section through the dielectric layer, wherein the heat radiating section is in an electrically floating state.

13 Claims, 7 Drawing Sheets

SURFACE-EMITTING TYPE SEMICONDUCTOR LASER AND ITS MANUFACTURING METHOD, AND OPTICAL MODULE

BACKGROUND

The present invention relates to surface-emitting type semiconductor lasers and a method for manufacturing the same, and optical modules.

Heat generated at the time of driving a surface-emitting type semiconductor laser may deteriorate its characteristics. Heat generation of a surface-emitting type semiconductor laser is mainly caused at its columnar section that composes a vertical resonator. For example, Patent Document 1 proposes a structure in which a columnar section is embedded in a metal electrode such that the metal electrode has a heat radiation effect. By this structure, since the metal electrode has a high thermal conductivity, heat at the columnar section can be effectively dissipated. However, according to this structure, because the columnar section is covered by the metal electrode, a dielectric layer that is provided between the metal electrode and a member having a reverse polarity of the metal electrode needs to be thinned. For this reason, a large parasitic capacitance is generated at the time of driving the surface-emitting type semiconductor laser, and the high frequency characteristics of the element may be deteriorated.

[Patent Document] Japanese Laid-open Patent Application HEI 5-283796.

SUMMARY

It is an object of the present invention to provide a surface-emitting type semiconductor laser that has an excellent luminescence property and can be driven at high speeds, and its manufacturing method.

Also, it is another object of the present invention to provide an optical module including the surface-emitting type semiconductor laser described above.

In a surface-emitting type semiconductor laser including a first mirror, an active layer and a second mirror formed above a substrate, the surface-emitting type semiconductor laser in accordance with the present invention includes:

a columnar section including at least a portion of the second mirror;

a first electrode formed above the first mirror or below the substrate;

a second electrode formed above the second mirror;

a dielectric layer formed around at least a portion of the columnar section and in contact with the columnar section; and a heat radiating section formed around at least a portion of the columnar section through the dielectric layer, wherein the heat radiating section is in an electrically floating state.

In a surface-emitting type semiconductor laser in accordance with the present invention, the case where another specific element (hereafter referred to as "B") is formed above a specific element (hereafter referred to as "A"), includes a case where B is formed directly on A, and a case where B is formed through another element above A. This similarly applies to a method for manufacturing a surface-emitting type semiconductor laser in accordance with the present invention.

In the surface-emitting type semiconductor laser in accordance with the present invention, when a specific element is in an electrically floating state, it means a state in which the specific element is electrically insulated from all other elements. Stated otherwise, it means a state in which a current path is not electrically connected to the specific element. It is noted that, even when a specific element is electrically connected to another element that is in an electrically floating state, the specific element can be in an electrically floating state.

According to the surface-emitting type semiconductor laser, the heat radiating section is in an electrically floating state. In other words, the heat radiating section is electrically insulated from other members by the dielectric layer. For this reason, when the surface-emitting type semiconductor laser is driven, a parasitic capacitance would not be generated between the heat radiating section and another member formed through the dielectric layer. As a result, a high-speed driving of the surface-emitting type semiconductor laser becomes possible.

The surface-emitting type semiconductor laser in accordance with the present invention may further include another dielectric layer formed around at least a portion of the columnar section in contact with the columnar section, wherein the second electrode may be formed above the other dielectric layer, and a film thickness of the other dielectric layer may be greater than a film thickness of the dielectric layer.

In the surface-emitting type semiconductor laser in accordance with the present invention, the heat radiating section may be composed of a metal.

In the surface-emitting type semiconductor laser in accordance with the present invention, the heat radiating section may have a multilayer structure.

In the surface-emitting type semiconductor laser in accordance with the present invention, the heat radiating section may be formed from a first heat radiating section and a second heat radiating section.

In the surface-emitting type semiconductor laser in accordance with the present invention, a film thickness of the dielectric layer may be 0.3 µm or less.

In the surface-emitting type semiconductor laser in accordance with the present invention, a film thickness of the other dielectric layer may be 1 µm or greater.

In the surface-emitting type semiconductor laser in accordance with the present invention, the dielectric layer may be silicon nitride, silicon oxide, aluminum nitride, silicon carbide or diamond.

In the surface-emitting type semiconductor laser in accordance with the present invention, the other dielectric layer may be a polyimide resin, an acrylic resin, or an epoxy resin.

The surface-emitting type semiconductor laser in accordance with the present invention may have a concave section around the columnar section, wherein a wall surface of the concave section may be composed of the dielectric layer and the other dielectric layer, and the heat radiating section may be embedded in the concave section.

In the surface-emitting type semiconductor laser in accordance with the present invention, a surface of the heat radiating section may be in an irregular state that contributes to radiation.

The surface-emitting type semiconductor laser in accordance with the present invention may include a protruded section formed above the first mirror, wherein the heat radiating section is formed above the protruded section through the dielectric layer.

In a method for manufacturing a surface-emitting type semiconductor laser including a first mirror, an active layer and a second mirror, the method for manufacturing a surface-emitting type semiconductor laser in accordance with the present invention includes:

a step of laminating semiconductor layers above a substrate;

a step of forming a columnar section by patterning the semiconductor layers;

a step of forming a first electrode above the first mirror or below the substrate;

a step of forming a second electrode above the second mirror;

a step of forming a dielectric layer around at least a portion of the columnar section and in contact with the columnar section; and a step of forming a heat radiating section around at least a portion of the columnar section through the dielectric layer, wherein the heat radiating section is formed in an electrically floating state.

The method for manufacturing a surface-emitting type semiconductor laser in accordance with the present invention may include a step of forming another dielectric layer around at least a portion of the columnar section in contact with the columnar section, wherein the second electrode may be formed above the other dielectric layer, and a film thickness of the other dielectric layer may be greater than a film thickness of the dielectric layer.

The method for manufacturing a surface-emitting type semiconductor laser in accordance with the present invention may include a step of forming a concave section around the columnar section, wherein a wall surface of the concave section may be composed of the dielectric layer and the other dielectric layer, and the heat radiating section may be formed to be embedded in the concave section.

In the method for manufacturing a surface-emitting type semiconductor laser in accordance with the present invention, the heat radiating section may be formed by a droplet jetting method or a dispenser method to be embedded in the concave section.

In the method for manufacturing a surface-emitting type semiconductor laser in accordance with the present invention, a surface of the heat radiating section may be formed to have an irregular state that contributes to heat radiation.

In the method for manufacturing a surface-emitting type semiconductor laser in accordance with the present invention, the surface of the heat radiating section may be formed by a dry etching method or a wet etching method to have the irregular state that contributes to heat radiation.

An optical module in accordance with the present invention may include the surface-emitting type semiconductor laser described above, and an optical waveguide.

The optical module in accordance with the present invention may include a wiring pattern that is electrically connected to the heat radiating section, wherein the wiring pattern is in an electrically floating state.

DETAILED DESCRIPTION OF EMBODIMENTS

Preferred embodiments of the present invention are described below with reference to the drawings.

1. First Embodiment 1-1. Device Structure

Figure 1:
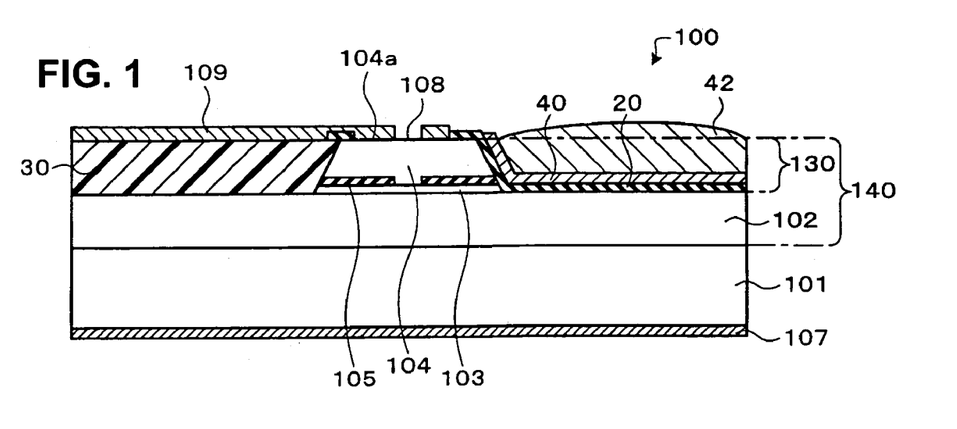
FIG. 1 is a cross-sectional view schematically showing a surface-emitting type semiconductor laser in accordance with a first embodiment.
Figure 2:
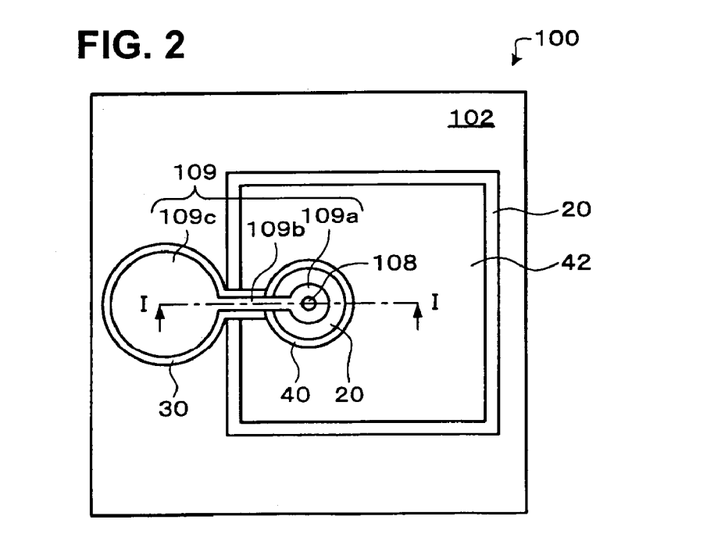
FIG. 2 is a plan view schematically showing the surface-emitting type semiconductor laser in accordance with the first embodiment.

FIG. 1 schematically shows a cross-sectional view of a surface-emitting type semiconductor laser (hereinafter also referred to as a "surface emitting laser") 100 in accordance with an embodiment of the present invention. FIG. 2 schematically shows a plan view of the surface-emitting type semiconductor laser 100 shown in FIG. 1. It is noted that FIG. 1 is a view indicating a cross section taken along a line I-I in FIG. 2.

The surface emitting laser 100 according to the present embodiment includes, as shown in FIG. 1 and FIG. 2, a semiconductor substrate (a GaAs substrate in the present embodiment) 101, a vertical resonator (hereafter referred to as a "resonator") 140 formed on the semiconductor substrate 101, a first electrode 107, a second electrode 109, a dielectric layer (hereafter referred to as a "first dielectric layer") 20, another dielectric layer (hereafter referred to as a "second dielectric layer") 30, a heat radiating section (hereafter referred to as a "first heat radiating section") 40, and another heat radiating section (hereafter referred to as a "second heat radiating section") 42. The resonator 140 includes a first mirror 102, an active layer 103, and a second mirror 104.

Next, components of the surface-emitting laser 100 are described below.

The resonator 140 may be formed, for example, from the first mirror 102 that is a distributed reflection type multilayer mirror of 40 pairs of alternately laminated n-type $Al_{0.9}Ga_{0.1}As$ layer and n-type $Al_{0.15}Ga_{0.85}As$ layer, the active layer 103 composed of GaAs well layers and $Al_{0.3}Ga_{0.7}As$ barrier layers in which the well layers include a quantum well structure composed of three layers, and the second mirror 104 that is a distributed reflection type multilayer mirror of 25 pairs of alternately laminated p-type $Al_{0.9}Ga_{0.1}As$ layer and p-type $Al_{0.15}Ga_{0.85}As$ layer. It is noted that the composition of each of the layers and the number of the layers forming the first mirror 102, the active layer 103 and the second mirror 104 are not limited to the above.

The second mirror 104 is made to be p-type, for example, by doping C, Zn or Mg, and the first mirror 102 is made to be n-type, for example, by doping Si or Se. Accordingly, the second mirror 104, the active layer 103 in which no impurity is doped, and the first mirror 102 form a pin diode.

The second mirror 104 and the active layer 103 compose a semiconductor deposited body in a pillar shape (hereafter referred to as a "columnar section") 130. The side surface of the columnar section 130 is covered with a first dielectric layer 20 and a second dielectric layer 30.

A dielectric layer 105, that functions as a current constricting layer, may be formed in a region among the layers composing the columnar section 130 near the active layer 103. The current constricting layer 105 can have a ring shape along the circumference of the columnar section 130. Also, the dielectric layer 105 for current constriction may be composed of aluminum oxide, for example.

The surface-emitting laser 100 of the present embodiment is provided with the first dielectric layer 20 and the second dielectric layer 30 in a manner to cover a side surface of the columnar portion 130 and an upper surface of the first mirror 102.

The first dielectric layer 20 is formed partially around the columnar section 130. The first dielectric layer 20 is in contact with the columnar section 130. As shown in FIG. 1 and FIG. 2, a side surface of the columnar section 130 is mainly covered by the first dielectric layer 20. Portions in the side surface of the columnar section 130 which are not covered by the first dielectric layer 20 are covered by the second dielectric layer 30. The second dielectric layer 30 is formed partially around the columnar section 130. The second dielectric layer 30 is in contact with the columnar section 130. The film thickness of the second dielectric layer 30 is formed to be greater than the film thickness of the first dielectric layer 20. The first dielectric layer 20 and the second dielectric layer 30 are described in greater detail below in the section of Device Manufacturing Method.

As shown in FIG. 1, the first heat radiating section 40 is formed around the columnar section 130 through the first dielectric layer 20. The second heat radiating section 42 is formed on the first heat radiating section 40. The second heat radiating section 42 embeds the first heat radiating section 40. The film thickness of the second heat radiating section 42 is formed to be greater than the film thickness of the first heat radiating section 40. The uppermost section of the second heat radiating section 42 may have about the same height as that of the height of the columnar section 130. Because the second heat radiating section 42 is formed thick, diffusion of heat generated at the columnar section 130 is improved. In other words, because the second heat radiating section 42 is formed thick, greater radiation effects can be obtained. As a result, the luminescence property of the surface-emitting laser 100 can be improved.

The first heat radiating section 40 and the second heat radiating section 42 are in an electrically floating state. More specifically, in the surface-emitting laser 100 shown in FIG. 1 and FIG. 2, the first heat radiating section 40 and the second heat radiating section 42 are electrically insulated from the first electrode 107, the semiconductor substrate 101, the first mirror 102, the active layer 103, the second mirror 104 and the second electrode 109. This electrical insulation is effected by the first dielectric layer 20.

The second electrode 109 is formed on the columnar section 130 and the second dielectric layer 30. The second electrode 109 is formed on a top surface 104a of the surface-emitting laser 140. The second electrode 109 has, as shown in FIG. 2, a connection section 109a having a ring-shaped plane configuration, a lead-out section 109a having a linear plane configuration, and a pad section 109c having a circular plane configuration. The second electrode 109 is electrically connected with the second mirror 104 in the connection section 109a. The lead-out section 109b of the second electrode 109 is connected with the connection section 109a and the pad section 109c. The pad section 109c of the second electrode 109 can be used as an electrode pad. An opening section in the second electrode 109 above the columnar section 130 defines an emission surface 108 of laser light. The second electrode 109 may be formed from a multilayer film of an alloy of gold (Au) and zinc (Zn), and gold (Au), for example.

Further, the first electrode 107 is formed on the back surface of the semiconductor substrate 101. The first electrode 107 is formed from a multilayer film of an alloy of gold (Au) and germanium (Ge), and gold (Au), for example. In other words, in the surface-emitting laser 100 shown in FIG. 1 and FIG. 2, the second electrode 109 connects to the second mirror 104 on the columnar section 130, and the first electrode 107 connects to the semiconductor substrate 101. An electrical current is injected in the active layer 103 through the second electrode 109 and the first electrode 107.

The materials to form the first and second electrodes 107 and 109 are not limited to those described above, and, for example, metals such as Cr, Ti, Ni, or Pt and these alloys, etc. can be used depending on the requirements for adhesion enforcement, diffusion prevention or anti-oxidation, etc.

1-2. Operation of Device

General operations of the surface-emitting type semiconductor laser 100 of the present embodiment are described below. It is noted that the following method for driving the surface-emitting type semiconductor laser 100 is described as an example, and various changes can be made without departing from the subject matter of the present invention.

First, when a voltage in a forward direction is applied to the pin diode by the first electrode 107 and the second electrode 109, recombination of electrons and holes occur in the active layer 103, thereby causing emission of light due to the recombination. Stimulated emission occurs during the period the generated light reciprocates between the second mirror 104 and the first mirror 102, whereby the light intensity is amplified. When the optical gain exceeds the optical loss, laser oscillation occurs, whereby laser light is emitted from the emission surface 108 that is present on the upper surface of the columnar section 130 in a direction perpendicular to the semiconductor substrate 101.

1-3. Device Manufacturing Method

Next, an example of a method of manufacturing the surface-emitting laser 100 in accordance with a first embodiment of the present invention is described with reference to FIG. 3 to FIG. 10. FIG. 3 to FIG. 10 are cross-sectional views schematically showing the steps of the method of manufacturing the surface-emitting type semiconductor laser 100 according to the present embodiment shown in FIG. 1 and FIG. 2, each of which corresponds to the cross section shown in FIG. 1.

Figure 3:
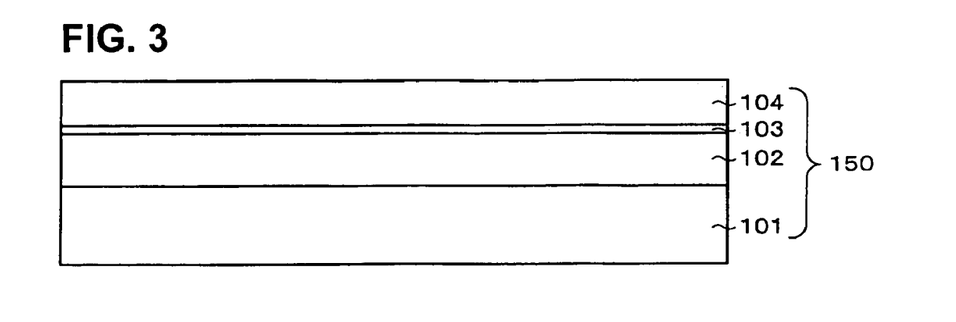
FIG. 3 is a cross-sectional view schematically showing a method for manufacturing the surface-emitting type semiconductor laser in accordance with the first embodiment.

(1) First, on the surface of the semiconductor substrate 101 composed of n-type GaAs, a semiconductor multilayer film 150 shown in FIG. 3 is formed by epitaxial growth while modifying its composition. It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, and a second mirror 104 of 25 pairs of alternately laminated p-type $Al_{0.9}Ga_{0.1}As$ layers and p-type $A_{0.15}Ga_{0.85}As$ layers. These layers are successively stacked in layers on the semiconductor substrate 101 to thereby form the semiconductor multilayer film 150.

When growing the second mirror 104, at least one layer thereof adjacent to the active layer 103 is formed as an AlAs layer or an AlGaAs layer that is later oxidized and becomes a dielectric layer for current constriction 105. The Al composition of the AlGaAs layer that is to become the dielectric layer 105 is 0.95 or greater, for example. Also, the uppermost surface layer of the second mirror 104 may preferably be formed to have a high carrier density such that ohm contact can be readily made with an electrode (second electrode 109).

The temperature at which the epitaxial growth is conducted is appropriately decided depending on the growth method, the kind of raw material, the type of the semiconductor substrate 101, and the kind, thickness and carrier density of the semiconductor multilayer film 150 to be formed, and in general may preferably be 450° C.-800° C. Also, the time required for conducting the epitaxial growth is appropriately decided like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 4:
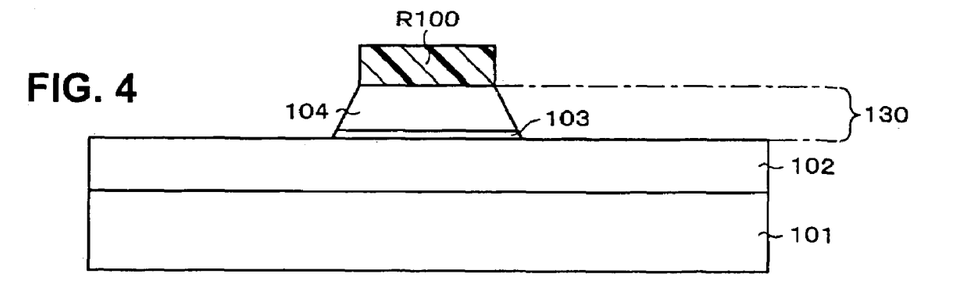
FIG. 4 is a cross-sectional view schematically showing the method for manufacturing the surface-emitting type semiconductor laser in accordance with the first embodiment.

Next, resist is coated on the semiconductor multilayer film 150, and then the resist is patterned by a lithography method, thereby forming a resist layer R100 having a specified pattern. The resist layer R100 is formed above an area where a columnar section 130 (see FIG. 1 and FIG. 2) is to be formed. Next, by using the resist layer R100 as a mask, the second mirror 104 and the active layer 103 are etched by, for example, a dry etching method, thereby forming a semiconductor deposited body in a pillar shape (columnar section) 130, as shown in FIG. 4. Then, the resist layer R100 is removed.

Figure 5:
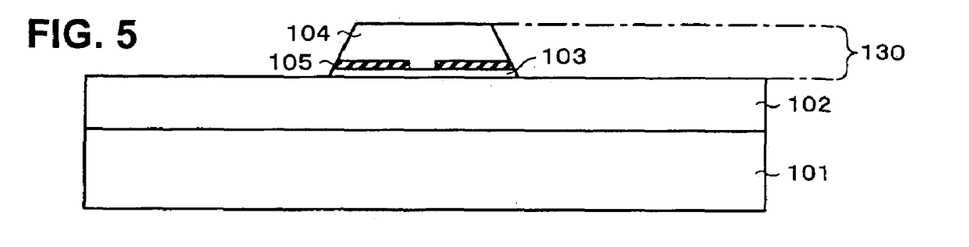
FIG. 5 is a cross-sectional view schematically showing the method for manufacturing the surface-emitting type semiconductor laser in accordance with the first embodiment.

Next, as indicated in FIG. 5, the semiconductor substrate 101 on which the columnar section 130 is formed through the aforementioned steps is placed in a water vapor atmosphere at about 400° C., for example. As a result, a layer having a high Al composition (a layer with an Al composition being 0.95 or higher, for example) among the second mirror 104 is oxidized from its side surface, thereby forming a dielectric layer for current constriction 105. The oxidation rate depends on the temperature of the furnace, the amount of water vapor supply, and the Al composition and the film thickness of the layer to be oxidized.

Figure 6:
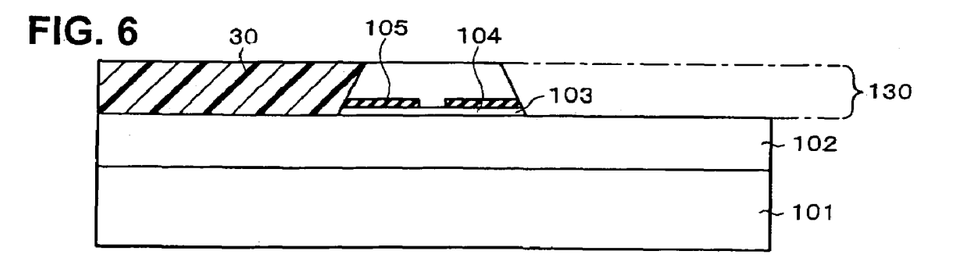
FIG. 6 is a cross-sectional view schematically showing the method for manufacturing the surface-emitting type semiconductor laser in accordance with the first embodiment.

(2) Next, as shown in FIG. 6, a second dielectric layer 30 is formed on the first mirror 102, around the columnar section 130, in a manner to contact with the columnar section 130. The second dielectric layer 30 is formed below a region where the second electrode 109 (see FIG. 1 and FIG. 2). In other words, the second dielectric layer 30 is formed to define a base of the second electrode 109.

The second dielectric layer 30 is formed in a manner to cover a side surface of the columnar section 130, and an upper surface of the first mirror 102 around the columnar section 130. The smaller the area that is covered by the second dielectric layer 30, the greater the area of the side surface of the columnar section 130 and upper surface of the first mirror 102 around the columnar section 130 which are covered by a first dielectric layer 20 to be described below becomes. By making the area that is covered by the first dielectric layer 20 greater, the area in a plan view of a first heat radiating section 40 and a second heat radiating section 42 to be described below can be made greater. By making the area in a plan view of the first heat radiating section 40 and the second heat radiating section 42, greater heat radiation effects can be obtained.

The area of the side surface of the columnar section 130 and the upper surface of the first mirror 102 around the columnar section 130 which is covered by the second dielectric layer 30 may be made small to the extent that the second dielectric layer 30 can function as a base of the second electrode 109.

The second dielectric layer 30 may be the one that can be readily formed into a thick film compared to the first dielectric layer 20. By forming the second dielectric layer 30 thick, a parasitic capacitance that may be generated through the second dielectric layer 30 can be reduced. In particular, when the film thickness of the second dielectric layer 20 is 1 μm or greater, the effect in reducing the parasitic capacitance is enhanced. Also, as shown in FIG. 6, the film thickness of the second dielectric layer 30 may be formed to have generally the same height as that of the height of the columnar section 130. As a result, in a later step of forming a second electrode 109 to be described below (see FIG. 1 and FIG. 2), the second electrode 109 can be formed flatly on the columnar section 130 and the second dielectric layer 30.

Resin can be used for the second dielectric layer 30, for example. As the resin, for example, a polyimide resin, an acrylic resin, an epoxy resin or the like may preferably be used. These materials are readily formed into a thick film, and their processing is easy.

Here, the case where a precursor of polyimide resin is used as the material for forming the second dielectric layer 30 is described. First, for example, by using a spin coat method, the precursor (precursor of polyimide resin) is coated on the semiconductor substrate 101, thereby forming a precursor layer. It is noted that, as the method for forming the precursor layer, besides the aforementioned spin coat method, another known technique, such as, a dipping method, a spray coat method, a droplet ejection method or the like can be used.

Then, the semiconductor substrate 101 is heated by using, for example, a hot plate or the like, thereby removing the solvent, and then is placed in a furnace at about 350° C. to thereby imidize the precursor layer, thereby forming a polyimide resin layer that is almost completely set. Then, as shown in FIG. 6, the polyimide resin layer is patterned by using a known lithography technique, thereby forming the second dielectric layer 30. As the etching method used for patterning, a dry etching method or the like can be used. Dry etching can be conducted with, for example, oxygen or argon plasma.

In the method for forming the second dielectric layer 30 described above, the description was made as to an example in which a precursor layer of polyimide resin is set, and then patterning is conducted. However, patterning may be conducted before the precursor layer of polyimide resin is set. As the etching method used for this patterning, a wet etching method or the like can be used. The wet etching can be conducted with, for example, an alkaline solution or an organic solution.

Figure 7:
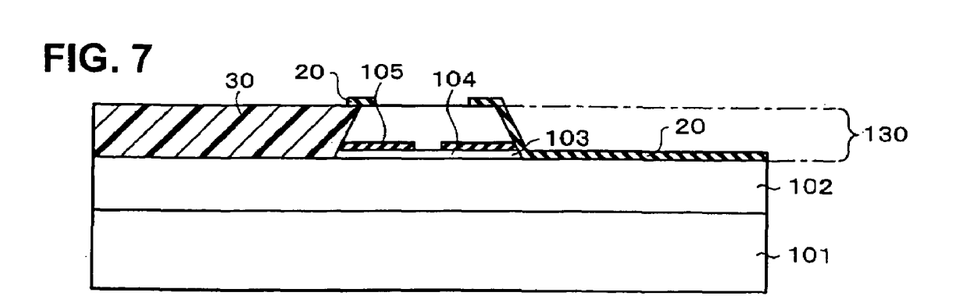
FIG. 7 is a cross-sectional view schematically showing the method for manufacturing the surface-emitting type semiconductor laser in accordance with the first embodiment.

(3) Next, as shown in FIG. 7, a first dielectric layer 20 is formed on the first mirror 102, in a manner to contact with the columnar section 130 around the columnar section 130. More specifically, the first dielectric layer 20 can be formed by a method as follows.

First, a dielectric layer (not shown) is formed on the entire surface over the semiconductor substrate 101 where the columnar section 130 is formed. The dielectric layer can be formed by, for example, a plasma CVD. Next, by using a known lithography technique, the dielectric layer is patterned, thereby forming a first dielectric layer 20. As the etching method used for this patterning, a dry etching method or a wet etching method can be used. The dry etching can be conducted with plasma including fluorine radical, for example. The wet etching can be conducted with hydrofluoric acid, for example.

For example, dielectric substance of inorganic system or a multilayer film of these substance can be used for the first dielectric layer 20. As the dielectric substance of inorganic system, for example, silicon nitride, silicon oxide, aluminum nitride, silicon carbide or diamond can be used. These material have good insulation in the form of a thin film, and good thermal conductivity, and can be readily processed.

The film thickness of the first dielectric layer 20 can be smaller than the film thickness of the second dielectric layer 30. By forming the first dielectric layer 20 thin, the thermal resistance of the first dielectric layer 20 can be reduced. In particular, when the film thickness of the first dielectric layer 20 is 0.3 μm or less, the thermal resistance can be reduced even further.

Figure 8:
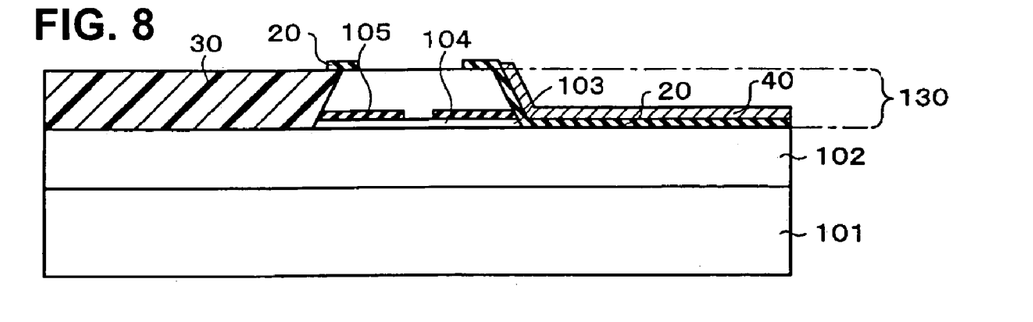
FIG. 8 is a cross-sectional view schematically showing the method for manufacturing the surface-emitting type semiconductor laser in accordance with the first embodiment.

(4) Next, as shown in FIG. 8, a first heat radiating section 40 is formed on the first dielectric layer 20, around the columnar section 130. More specifically, first, by using a vapor deposition method, a sputter method, or a CVD method, for example, a layer (not shown) that becomes the first heat radiating section 40 is formed over the entire surface of the columnar section 130, the first dielectric layer 20 and the second dielectric layer 30. Next, by using a known lithography technique, the layer that becomes the first heat radiating section 40 is patterned. As a result, the first heat radiating section 40 is formed.

A material having good heat radiation property can be used for the first heat radiating section 40. In other words, a material having good thermal conductivity can be used for the first heat radiating section 40. For example, metal or alloy composed of plural kinds of metal can be uses as the material having good heat radiation property.

(5) Next, a second heat radiating section 42 is formed on the first heat radiating section 40, around the columnar section 130. A material having good heat radiation property can be used for the second heat radiating section 42 like the first heat radiating section 40. In other words, a material having good thermal conductivity can be used for the second heat radiating section 42. For example, metal or alloy composed of plural kinds of metal can be used as the material having good heat radiation property.

Figure 9:
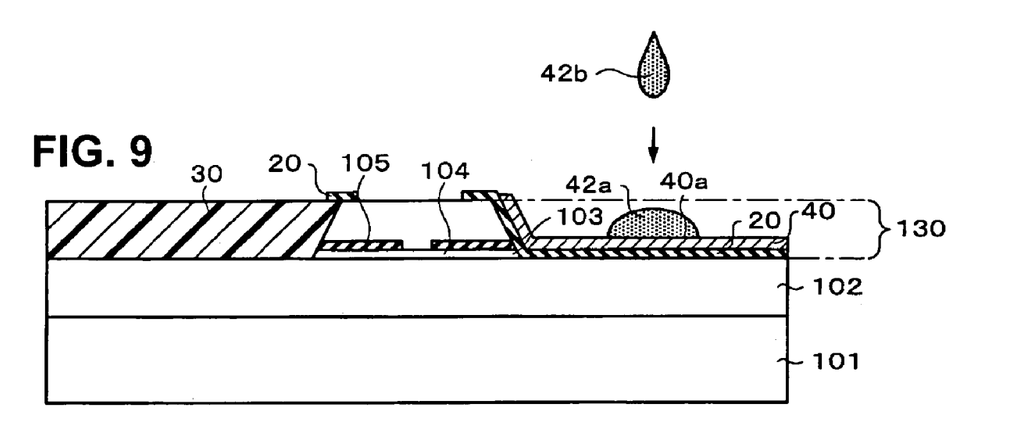
FIG. 9 is a cross-sectional view schematically showing the method for manufacturing the surface-emitting type semiconductor laser in accordance with the first embodiment.

The second heat radiating section 42 may preferably be formed thick such that its uppermost section has generally the same height as that of the height of the columnar section 130. Here, the case of using metal material in a liquid state is described as a method to form the second heat radiating section 42. First, as shown in FIG. 9, droplets 42b for forming the second heat radiating section 42 are dripped on an upper surface 40a of the first heat radiating section 40, thereby forming a liquid metal layer 42a. As the droplets 42b, liquefied metal of the material for forming the second heat radiating section 42, a compound in a liquid state including desired metal elements, a solution in which metal fine particles are dispersed in a solvent, or the like can be used. More specifically, as the droplets 42b, a low melting point alloy such as an alloy of gold (Au) and tin (Sn), a compound such as nickel sulfate, nickel hydrochloride or the like, a solution dispersed with fine particles of gold (Au), silver (Ag) or the like can be enumerated.

As the method of dripping the droplets 42b, for example, a droplet ejection method represented by an ink jet method, or a dispenser method can be enumerated. By using one of these methods, the second heat radiating section 42 can be readily formed thick. Dripping of the droplets 42b are continued, for example, until the liquid metal layer 42a embeds the first heat radiating section 40.

Figure 10:
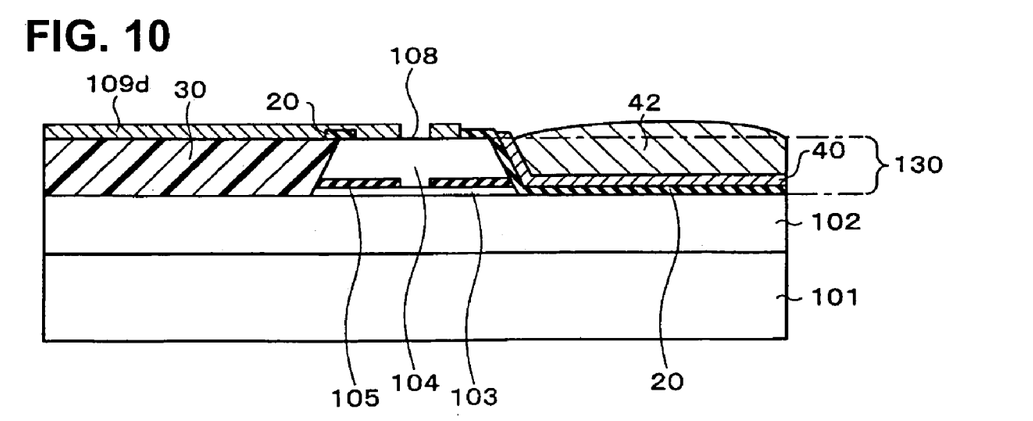
FIG. 10 is a cross-sectional view schematically showing the method for manufacturing the surface-emitting type semiconductor laser in accordance with the first embodiment.

Next, a heating or cooling process is conducted for the liquid metal layer 42a depending on the kind of the liquid metal layer 42a. By this, the liquid metal layer 42a is hardened. As a result, the second heat radiating section 42 is formed, as shown in FIG. 10.

It is noted that, besides the aforementioned method of ejecting the droplets 42b, a known plating method may be used to form the second heat radiating section 42. In this case, the first heat radiating section 40 can be used as a seed layer.

(6) Next, the steps of forming a first electrode 107 and a second electrode 109 for injecting an electric current into the active layer 103, and an emission surface 108 of laser light (see FIG. 1 and FIG. 2) are described.

Prior to forming the first electrode 107 and the second electrode 109, an exposed upper surface of the columnar section 130 and the semiconductor substrate 101 may be washed by using a plasma treatment method, or the like, depending on the requirements. By this treatment, a device of more stable characteristics can be formed. Then, for example, a multilayer film 109d of, for example, gold (Au) and an alloy of gold (Au) and zinc (Zn), is formed by, for example, a vacuum deposition method or a sputter method on the entire upper surface of the semiconductor substrate 101 where the second heat radiating section 42 is formed. Then, as shown in FIG. 10, a portion where the multilayer film 109d is not formed is formed on a part of the upper surface of the columnar section 130 and at least on the upper surface of the first dielectric layer 20 by a lift-off method. It is noted that, a portion where the multilayer film 109d is not formed can be formed on the upper surface of at least one of the first heat radiating section 40 and the second heat radiating section 42.

The portion on the upper surface of the columnar section 130 where the multilayer film 109d is not formed becomes an emission surface 108. By forming the portion on the upper surface of the first dielectric layer 20 where multilayer film 109d is not formed, the first heat radiating section 40 and the second heat radiating section 42 can be insulated from the multilayer film 109d that is to become a second electrode 109. It is noted that, in the above step, a dry etching method or a wet etching method can be used instead of the lift-off method.

Also, a multilayer film of gold (Au) and an alloy of gold (Au) and germanium (Ge), for example, is formed by, for example, a vacuum deposition method or a sputter method on an exposed back surface of the semiconductor substrate 101. Next, an annealing treatment is conducted. The temperature of the annealing treatment depends on the electrode material. This is usually conducted at about 400° C. for the electrode material used in the present embodiment. By this, the first electrode 107 and the second electrode 109 are formed (see FIG. 1 and FIG. 2).

By the process described above, the surface-emitting type semiconductor laser 100 shown in FIG. 1 and FIG. 2 can be obtained.

1-4. Actions and Effects

In the surface-emitting type semiconductor laser 100 in accordance with the present embodiment, the first heat radiating section 40 and the second heat radiating section 42 are in an electrically floating state. In other words, the first heat radiating section 40 and the second heat radiating section 42 are electrically insulated from other members. For this reason, when the surface-emitting type semiconductor laser 100 in accordance with the present embodiment is driven, a parasitic capacitance would not be generated between the first heat radiating section 40 and the second heat radiating section 42 and other members formed through the first dielectric layer 20. As a result, a high-speed drive of the surface-emitting type semiconductor laser 140 becomes possible.

By the surface-emitting type semiconductor laser 100 in accordance with the present embodiment, no parasitic capacitance is generated by the first heat radiating section 40 and the second heat radiating section 42, such that the film thickness of the first dielectric layer 20 can be made small. In other words, if a parasitic capacitance were to be generated, such parasitic capacitance would be reduced by making the film thickness of the first dielectric layer 20 greater. However, by the surface-emitting type semiconductor laser 100 in accordance with the present embodiment, no parasitic capacitance is generated, such that the film thickness of the first dielectric layer 20 can be made small. Because the first dielectric layer 20 can be made thin, the thermal resistance of the first dielectric layer 20 can be reduced, and greater heat radiating effects can be obtained. As a result, the luminescence property of the surface-emitting type semiconductor laser 100 can be made better.

In the surface-emitting type semiconductor laser 100 in accordance with the present embodiment, two layers of heat radiating sections, i.e., the first heat radiating section 40 and the second heat radiating section 42, are formed. Accordingly, a variety of combinations of heat radiating sections can be used according to specific uses. For example, for the first heat radiating section 40, one that can be readily micro-processed can be used. Also, for the second heat radiating section 42, for example, one that is readily formed into a thick film can be used.

1-5. Modified Examples

Figure 11:
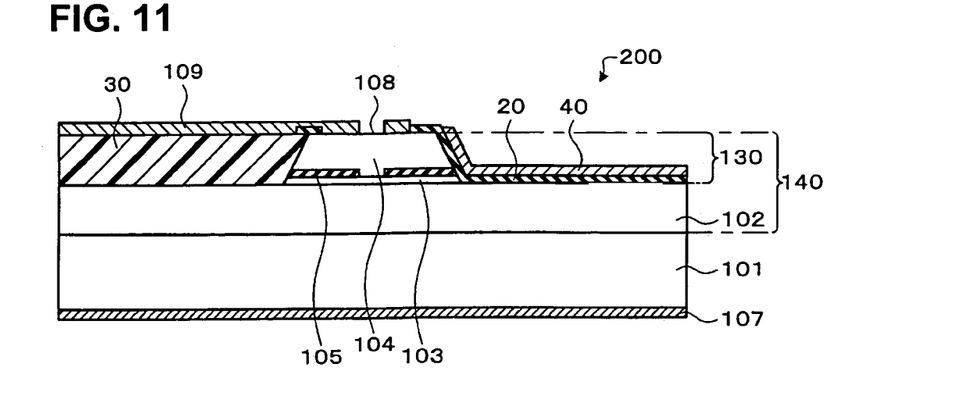
FIG. 11 is a cross-sectional view schematically showing a surface-emitting type semiconductor laser in accordance with the first embodiment.
Figure 12:
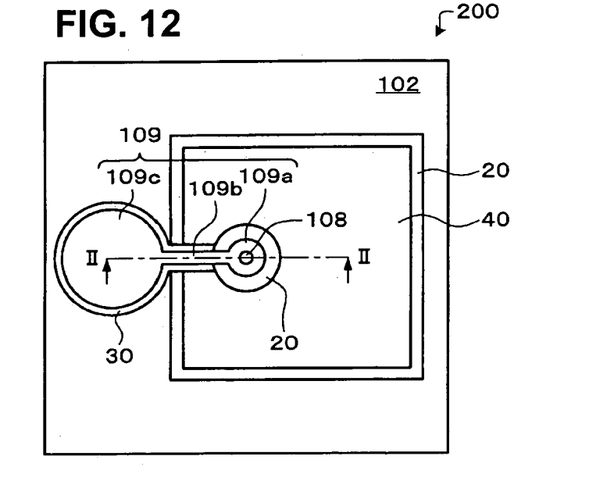
FIG. 12 is a plan view schematically showing the surface-emitting type semiconductor laser in accordance with the first embodiment.

In the surface-emitting laser 100 shown in FIG. 1 and FIG. 2, the first heat radiating section 40 is formed on the first dielectric layer 20, and the second heat radiating section 42 is formed on the first heat radiating section 40. However, as shown in FIG. 11 and FIG. 12, only the first heat radiating section 40 may be provided on the first dielectric layer 20. Alternatively, although not illustrated, only the second heat radiating section 42 may be provided on the first dielectric layer 20. By so doing, the number of steps can be reduced, and therefore the process can be simplified. It is noted that FIG. 11 schematically shows a cross-sectional view of a surface-emitting laser 200 in this case. Further, FIG. 12 schematically shows a plan view of the surface-emitting laser 200 shown in FIG. 11. It is noted that FIG. 11 is a view showing a cross section taken along a line II-II in FIG. 12.

Figure 13:
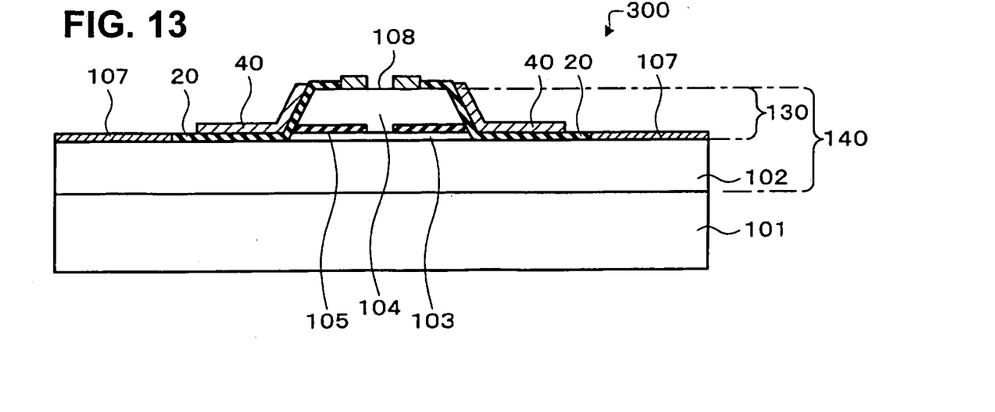
FIG. 13 is a cross-sectional view schematically showing a surface-emitting type semiconductor laser in accordance with the first embodiment.
Figure 14:
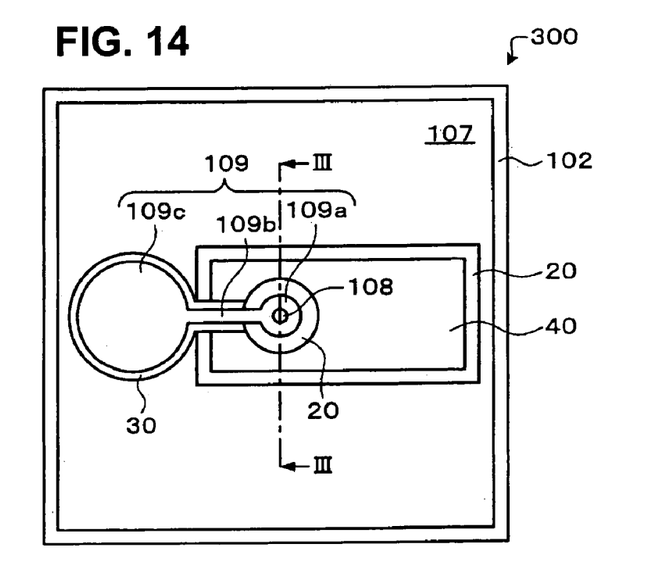
FIG. 14 is a plan view schematically showing the surface-emitting type semiconductor laser in accordance with the first embodiment.

In the surface-emitting laser 100 shown in FIG. 1 and FIG. 2, the first electrode 107 is provided on the back surface 101b of the semiconductor substrate 101. However, as shown in FIG. 13 and FIG. 14, the first electrode 107 may be provided on the first mirror 102. By this, surface mounting such as flip-chip bonding can be made. It is noted that, although the second heat radiating section 42 is not provided in the example shown in FIG. 13 and FIG. 14, the second heat radiating section 42 can be provided on the first heat radiating section 40 like the surface-emitting laser 100 shown in FIG. 1 and FIG. 2. It is noted that FIG. 13 schematically shows a cross-sectional view of a surface-emitting laser 300 in this case. Further, FIG. 14 schematically shows a plan view of the surface-emitting laser 300 shown in FIG. 13. It is noted that FIG. 13 is a view showing a cross section taken along a line III-III in FIG. 14.

Figure 15:
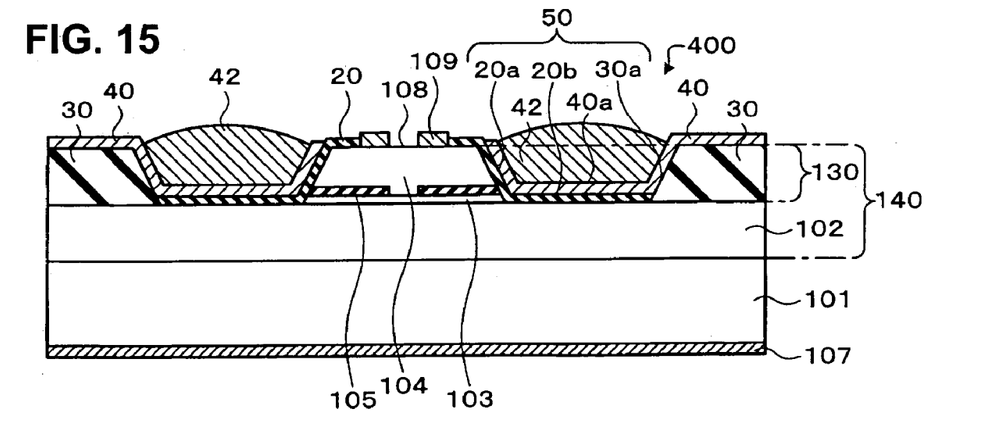
FIG. 15 is a cross-sectional view schematically showing a surface-emitting type semiconductor laser in accordance with the first embodiment.
Figure 16:
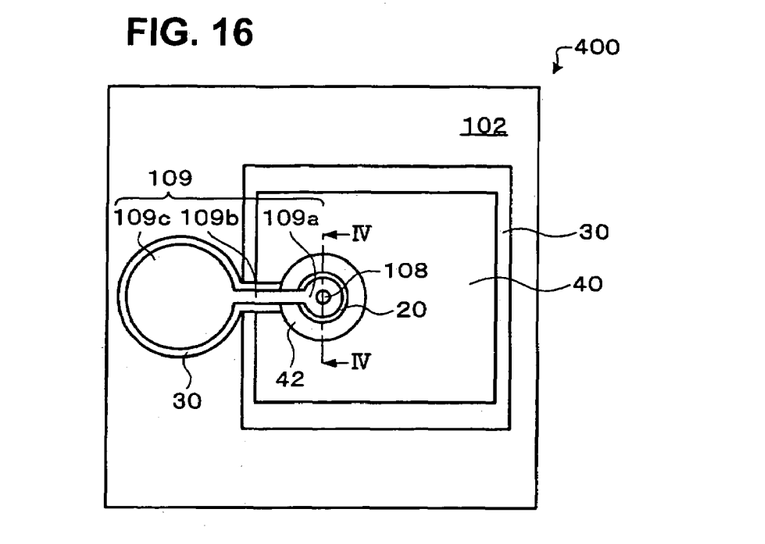
FIG. 16 is a plan view schematically showing the surface-emitting type semiconductor laser in accordance with the first embodiment.

FIG. 15 schematically shows a cross-sectional view of a surface-emitting laser 400 in accordance with an embodiment of the present invention. FIG. 16 schematically shows a plan view of the surface-emitting laser 400 shown in FIG. 15. FIG. 15 is a view showing a cross section taken along a line IV-IV in FIG. 16. It is noted that the same reference numerals are appended to components that are substantially the same as those of the surface-emitting laser 100 shown in FIG. 1 and FIG. 2, and their detailed description is omitted.

The surface-emitting laser 400 has a structure different from that of the surface-emitting laser 100 shown in FIG. 1 and FIG. 2 in that a concave section 50 is provided around a columnar section 130, and a first heat radiating section 40 and a second heat radiating section 42 are embedded in the concave section 50.

More specifically, as shown in FIG. 15, a wall surface of the concave section 50 is composed of a side surface 20a of a first dielectric layer 20, an upper surface 20b of the first dielectric layer 20, and a side surface 30a of a second dielectric layer 30. The first heat radiating section 40 is formed on the wall surface of the concave section 50. Also, the second heat radiating section 42 is formed on the first heat radiating section 40. In other words, the first heat radiating section 40 and the second heat radiating section 42 are embedded in the concave section 50.

Next, one example of a method for manufacturing the surface-emitting laser 400 shown in FIG. 15 and FIG. 16 is described.

The surface-emitting laser 400 can be formed by steps that are generally the same as those of the process of manufacturing the surface-emitting laser 100 shown in FIG. 1 and FIG. 2. More specifically, it is formed by steps that are generally the same as those of the process of manufacturing the surface-emitting laser 100 shown in FIG. 1 and FIG. 2 except that the concave section 50 is formed around the columnar section 130, and the first heat radiating section 40 and the second heat radiating section 42 are embedded in the concave section 50. Therefore, the description is made here as to aspects that are different from the process of manufacturing the surface-emitting laser 100 shown in FIG. 1 and FIG. 2.

One aspect that is different from the process of manufacturing the surface-emitting laser 100 shown in FIG. 1 and FIG. 2 is as follows. In the steps of forming a second dielectric layer 30 (see FIG. 6), in accordance with the process of manufacturing the surface-emitting laser 400 shown in FIG. 15 and FIG. 16, the second dielectric layer 30 is formed in a region where a second electrode 109 is scheduled to be formed, around the columnar section 130, but in a region that does not contact with the columnar section 130. More specifically, as shown in FIG. 15 and FIG. 16, the second dielectric layer 30 is formed in the shape of a rectangle as viewed in a plan view. Also, the second dielectric layer 30 forms a circular ring-shaped opening section concentric with the columnar section 130 around the columnar section 130. In other words, a wall surface of the ring-shaped opening section is composed of a side surface 30a of the second dielectric layer 30, an upper surface of the first mirror 102, and a side surface of the columnar section 130. It is noted that, as viewed in a plan view, the second dielectric layer 30 is formed in a manner to define a base of the second electrode 109 in the region where the second electrode 109 is scheduled to be formed. Accordingly, the ring-shaped opening section described above is formed to have a configuration in which a portion of a ring shape is cut as viewed in a plan view.

Also, one aspect that is different from the process of manufacturing the surface-emitting laser 100 shown in FIG. 1 and FIG. 2 is as follows. In the steps of forming a first dielectric layer 20 (see FIG. 7), in accordance with the process of manufacturing the surface-emitting laser 400 shown in FIG. 15 and FIG. 16, the first dielectric layer 20 is not formed on the second dielectric layer 30 that is formed in a region that does not contact with the columnar section 130, around the columnar section 130 described above. It is noted that the first dielectric layer 20 can be formed on the second dielectric layer 30 that is formed in a region that does not contact with the columnar section 130, around the columnar section 130 described above.

Also, one aspect that is different from the process of manufacturing the surface-emitting laser 100 shown in FIG. 1 and FIG. 2 is as follows. In the steps of forming a first heat radiating section 40 and a second heat radiating section 42 (see FIG. 8-FIG. 10), the first heat radiating section 40 and the second heat radiating section 42 are formed in a manner to be embedded in the concave section 50 that is composed by a side surface 20a of the first dielectric layer 20, an upper surface 20b of the first dielectric layer 20, and a side surface 30a of the second dielectric layer 30. By forming the second heat radiating section 42 in a manner to be embedded in the concave section 50 through the first heat radiating section 40, the position to form the second heat radiating section 42 can be readily controlled in the steps of forming the second heat radiating section 42.

More specifically, droplets 42b (see FIG. 9) are ejected toward a bottom surface of the concave section 50 where the first heat radiating section 40 is formed, in other words, toward an upper surface 40a of the first heat radiating section 40 shown in FIG. 15. In this case, there are variations in some degree in the ejection angle of the droplets 42b ejected. However, if the droplets 42b impact on positions inside the concave section 50, a liquid metal layer 42a (see FIG. 9) wets and spreads in the region surrounded by the first heat radiating section 40, and the positions are automatically corrected. Accordingly, the position where the second heat radiating section 42 is formed can be readily controlled.

Figure 17:
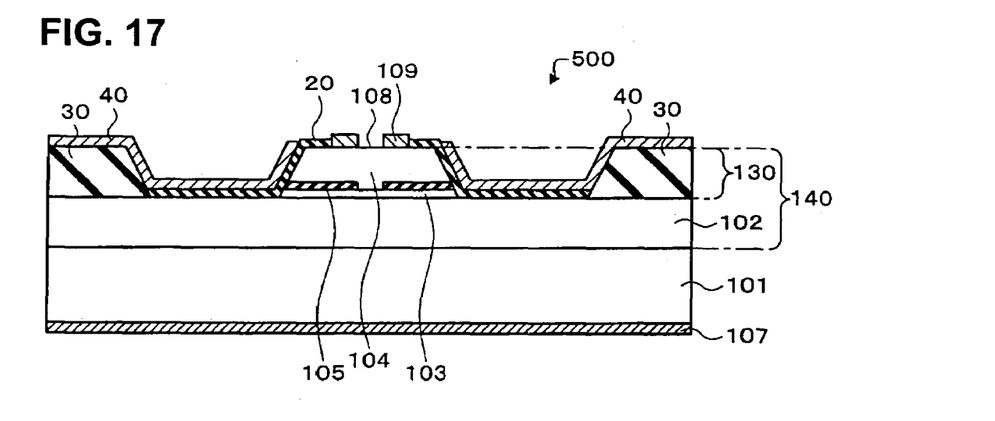
FIG. 17 is a cross-sectional view schematically showing a surface-emitting type semiconductor laser in accordance with the first embodiment.

In the surface-emitting laser 400 shown in FIG. 15 and FIG. 16, the first heat radiating section 40 is formed on the first dielectric layer 20 and the second dielectric layer 30, and the second heat radiating section 42 is formed on the first heat radiating section 40. However, as shown in FIG. 17, only the first heat radiating section 40 may be provided on the first dielectric layer 20. Alternatively, although not illustrated, only the second heat radiating section 42 may be provided on the first dielectric layer 20. By so doing, the number of steps can be reduced, and therefore the process can be simplified. It is noted that FIG. 17 schematically shows a cross-sectional view of a surface-emitting laser 500 in this case, which corresponds to a cross-sectional view of FIG. 15.

Figure 18:
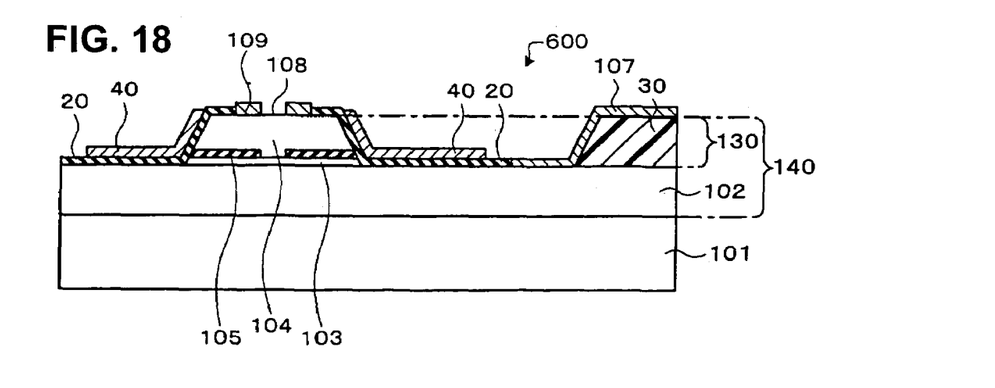
FIG. 18 is a cross-sectional view schematically showing a surface-emitting type semiconductor laser in accordance with the first embodiment.

Also, for example, as shown in FIG. 18, the first electrode 107 can be formed on the second dielectric layer 30. By this, the first electrode 107 and the uppermost surface of the second electrode 109 can be provided with generally the same height. Accordingly, it is advantageous when surface mounting such as flip-chip bonding is conducted.

Figure 19:
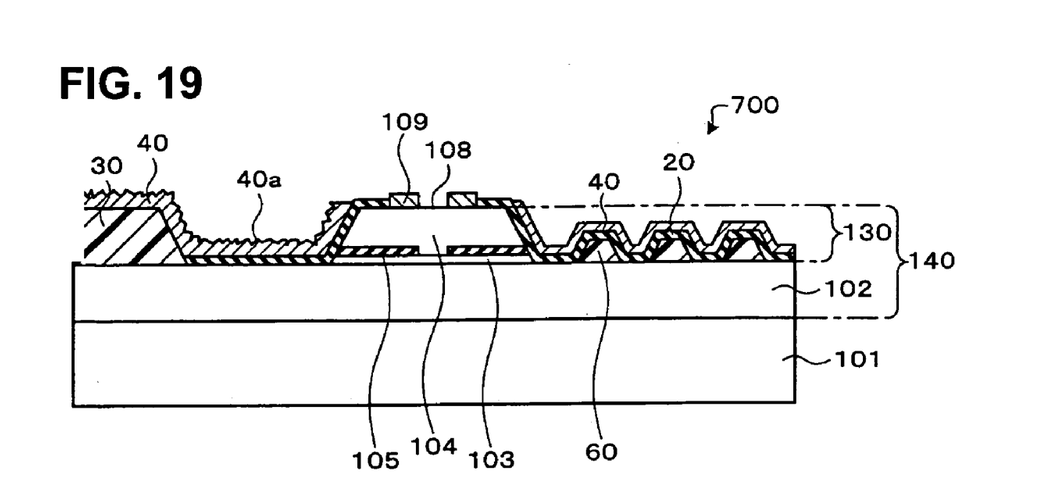
FIG. 19 is a cross-sectional view schematically showing a surface-emitting type semiconductor laser in accordance with the first embodiment.

Also, for example, as shown in FIG. 19, a surface 40a of the first heat radiating section 40 can be formed with concaves and convexes that contribute to heat radiation. By this, the surface area of the first heat radiating section 40 increases such that its heat radiating property improves. These concaves and convexes can be formed by a dry etching method or a wet etching method. It is noted that, although not illustrated, the surface of the second heat radiating section 42 can also be formed with concaves and convexes that contribute to heat radiation.

Further, for example, as shown in FIG. 19, protruded sections 60 may be formed over the first mirror 102, and the first heat radiating section 40 can be formed over the protruded sections 60 through the first dielectric layer 20. By this, the surface area of the first heat radiating section 40 increases, such that its heat radiating property improves. The protruded sections 60 can be formed by a variety of methods. For example, they can be formed by patterning a semiconductor layer 150 (see FIG. 3). Also, for example, they can be formed by forming a dielectric film of inorganic system or a resin layer on the first mirror 102, and patterning the same by using a known lithography technique. As the dielectric film of inorganic system, silicon oxide, silicon nitride or the like can be used. As the resin layer, polyimide resin or the like can be used.

2. Second Embodiment

Figure 20:
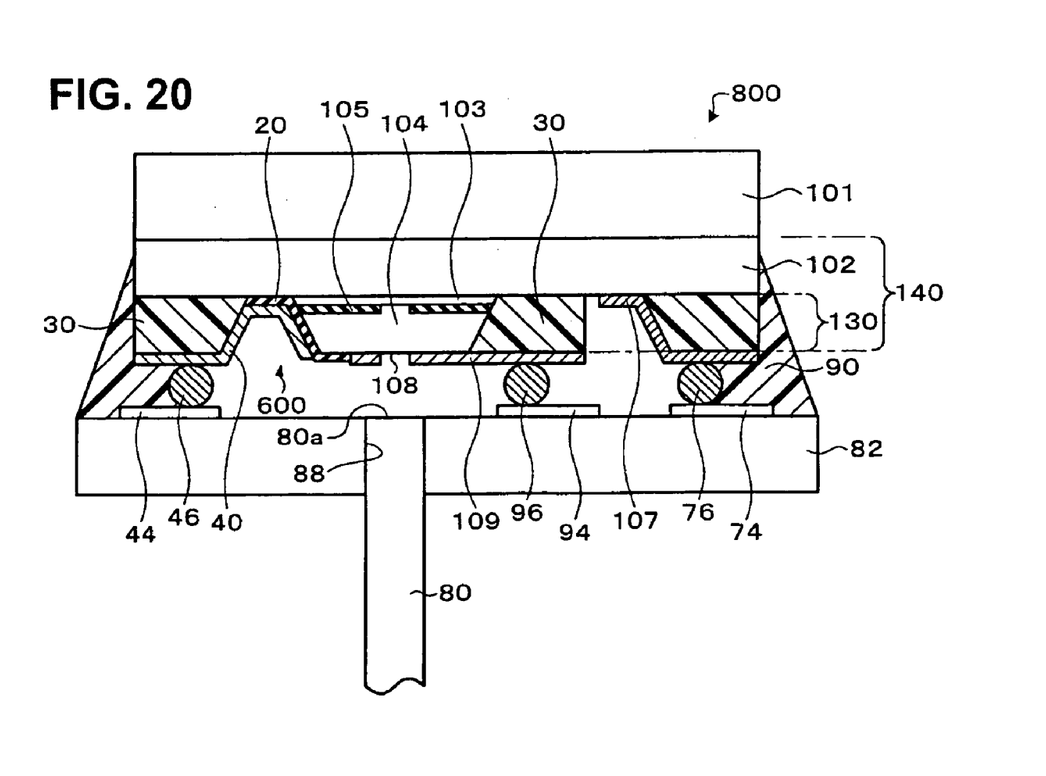
FIG. 20 is a cross-sectional view schematically showing an optical module in accordance with a second embodiment.

FIG. 20 schematically shows an optical module 800 in accordance with the a second embodiment of the present invention. The optical module 800 includes a surface-emitting type semiconductor laser in accordance with the first embodiment (hereafter also referred to as a "surface-emitting laser") 600 (see FIG. 18), an optical fiber 80, and a mounting substrate 82.

Light that is emitted from the emission surface 108 of the surface-emitting laser 600 enters the optical fiber 80. The surface-emitting laser 600 is in a state in which its position relative to an end face 80a of the optical fiber 80 is fixed. Specifically, the emission surface 108 of the surface-emitting laser 600 is disposed opposite to the end face 80a of the optical fiber 80.

The mounting substrate 82 is provided for driving the surface-emitting laser 600. In other words, a circuit for driving the surface-emitting laser 600 is built in the mounting substrate 82. The mounting substrate 82 is formed with a first wiring pattern 74, a second wiring pattern 94, and a third wiring pattern 44.

The mounting substrate 82 is electrically connected to the surface-emitting laser 600. More specifically, the first electrode 107 of the surface-emitting laser 600 is electrically connected to the first wiring pattern 74 formed on the mounting substrate 82 through a first ball bump 76. Also, the second electrode 109 of the surface-emitting laser 600 is electrically connected to the second wiring pattern 94 formed on the mounting surface 82 through a ball bump 96. Also, the first heat radiating section 40 of the surface-emitting laser 600 is electrically connected to the third wiring pattern 44 formed on the mounting substrate 82 through a third ball bump 46.

The third wiring pattern 44 is in an electrically floating state. More specifically, in the illustrated example, the third wiring pattern 44 is electrically insulated from members other than the first heat radiating section 40 and the third ball bump 46, such as, for example, the first wiring pattern 74 and the second wiring pattern 94. By this, the first heat radiating section 40 that is electrically connected to the third wiring pattern 44 through the third ball bump 46 can be in an electrically floating state. For this reason, a parasitic capacitance is not generated between the first heat radiating section 40 and the other members formed through the first dielectric layer 20. As a result, a high-speed drive of the surface-emitting laser 600 becomes possible.

The mounting substrate 82 can be provided with a heat sink (not shown). The third wiring pattern 44 can be connected to the heat sink. In this case, the heat sink can also be in an electrically floating state, such that the first heat radiating section 40 can be in an electrically floating state. For this reason, a parasitic capacitance is not generated between the first heat radiating section 40 and the other members formed through the first dielectric layer 20. As a result, a high-speed driving of the surface-emitting laser 600 becomes possible.

Furthermore, by connecting the first heat radiating section 40 to the heat sink through the third ball bump 46 and the third wiring pattern 44, heat generated in the surface-emitting laser 600 can be more effectively radiated outside. As a result, the luminescence property of the surface-emitting laser 600 can be made better.

The surface-emitting laser 600 can be face-down mounted to the mounting substrate 82. By so doing, the first-third ball bumps 76, 96 and 46 not only provide electrical connection but affix the surface-emitting type semiconductor laser 600 and the mounting substrate 82. It is noted that the first electrode 107, the second electrode 109 and the first heat radiating section 40 can be connected to the first-third wiring patterns 74, 94 and 44 by using wires, electroconductive paste, or the like.

Side fill material 90 is formed between the surface-emitting laser 600 and the mounting substrate 82. The side fill material 90 maintains the bonded state of the surface-emitting laser 600 and the mounting substrate 82. It is noted that under fill material can be used instead of the side fill material 90.

An aperture (for example, a through hole) 88 is formed in the mounting substrate 82. The optical fiber 80 is inserted in the aperture 88. The aperture 88 is formed avoiding the internal circuit, extending from the surface on which the first-third wiring patterns 74, 94 and 44 are formed to the surface on the opposite side thereof.

The optical fiber 80 may be a single mode fiber, or a multimode fiber. When the surface-emitting laser 600 emits light in multimode, the use of a multimode fiber as the optical fiber 80 can secure introduction of light emitted from the surface-emitting laser 600 to the optical fiber 80.

It is noted that, in the example described above, the first heat radiating section 40 is electrically connected to the third wiring pattern 44 through the third ball bump 46. However, for example, the third ball bump 46 may not be provided such that the first heat radiating section 40 is not electrically connected to the third wiring pattern.

Also, in the example described above, the optical module 800 in accordance with the present embodiment has the surface-emitting laser 600 shown in FIG. 18. However, the optical module 800 in accordance with the present embodiment can have another surface-emitting laser described in the first embodiment.

Preferred embodiments of the present invention are described above, but the present invention is not limited to them, and various modes can be implemented. For example, interchanging the p-type and n-type property of each of the semiconductor layers in the above described embodiments does not deviate from the subject matter of the present invention.

Also, for example, in the embodiments described above, the description is made as to the surface-emitting lasers having a single columnar section. However, a plurality of columnar sections can be provided within the same substrate surface. Also, even when a plurality of surface-emitting lasers is formed into an array, similar actions and effects can be obtained.

Also, for example, in the embodiments described above, the description is made as to those with ALGaAs systems. However, other material systems, such as, for example, semiconductor materials of GaInP system, ZnSSe system, InGaAs system, InGaN system, AlGaN system, GaInNAs system, and GaAsSb system, etc. can also be used.

What is claimed is:

1. A surface-emitting type semiconductor laser including a first mirror, an active layer and a second mirror, the surface-emitting type semiconductor laser comprising:
   a columnar section including at least a portion of the second mirror;
   a first electrode formed above the first mirror or below the first mirror;
   a second electrode formed above the second mirror;
   a first dielectric layer formed around at least a portion of the columnar section and in contact with the columnar section;
   a heat radiating section formed around at least a portion of the columnar section through the first dielectric layer, wherein the heat radiating section is in an electrically floating state;
   a second dielectric layer formed around at least a portion of the columnar section and in contact with the columnar section, wherein the second electrode is formed above the second dielectric layer, and
   a film thickness of the second dielectric layer is greater than a film thickness of the first dielectric layer.

2. A surface-emitting type semiconductor laser according to claim 1, wherein the heat radiating section is composed of a metal.

3. A surface-emitting type semiconductor laser according to claim 1, wherein the heat radiating section has a multi-layer structure.

4. A surface-emitting type semiconductor laser according to claim 1, wherein the heat radiating section is formed from a first heat radiating section and a second heat radiating section.

5. A surface-emitting type semiconductor laser according to claim 1, wherein a film thickness of the first dielectric layer is 0.3 μm or less.

6. A surface-emitting type semiconductor laser according to claim 1, wherein a film thickness of the second dielectric layer is 1 μm or greater.

7. A surface-emitting type semiconductor laser according to claim 1, wherein the first dielectric layer is silicon nitride, silicon oxide, aluminum nitride, silicon carbide or diamond.

8. A surface-emitting type semiconductor laser according to claim 1, wherein the second dielectric layer is a polyimide resin, an acrylic resin, or an epoxy resin.

9. A surface-emitting type semiconductor laser according to claim 1, comprising a concave section around the columnar section, wherein
   a wall surface of the concave section is composed of the first dielectric layer and the second dielectric layer, and
   the heat radiating section is embedded in the concave section.

10. A surface-emitting type semiconductor laser according to claim 1, wherein
    a surface of the heat radiating section is in an irregular state that contributes to heat radiation.

11. A surface-emitting type semiconductor laser according to claim 1, comprising
    a protruded section formed above the first mirror, wherein the heat radiating section is formed above the protruded section through the first dielectric layer.

12. An optical module comprising a surface-emitting type semiconductor laser according to claim 1, and an optical waveguide.

13. An optical module according to claim 12, comprising
    a wiring pattern that is electrically connected to the heat radiating section,
    wherein the wiring pattern is in an electrically floating state.

* * * * *